(12) United States Patent
Takahashi et al.

(10) Patent No.: US 6,490,164 B2
(45) Date of Patent: Dec. 3, 2002

(54) ATTACHMENT STRUCTURE OF ELECTRONIC COMPONENT TO CIRCUIT BOARD AND CLIP USED IN ATTACHMENT OF THE ELECTRONIC COMPONENT

(75) Inventors: Hideyuki Takahashi, Tokyo (JP); Shoji Hino, Tokyo (JP)

(73) Assignee: Calsonic Kansei Corporation, Tokyo (JP)

( * ) Notice: Subject to any disclaimer, the term of this patent is extended or adjusted under 35 U.S.C. 154(b) by 0 days.

(21) Appl. No.: 09/854,478

(22) Filed: May 15, 2001

(65) Prior Publication Data

US 2001/0043464 A1 Nov. 22, 2001

(30) Foreign Application Priority Data

May 16, 2000 (JP) ........................................ 2000-143635

(51) Int. Cl.[7] .............................. H05K 5/00; H05K 5/04; H05K 5/06
(52) U.S. Cl. ....................... 361/752; 801/803; 801/804; 801/758-759; 801/719; 801/720; 174/138 G
(58) Field of Search ................................ 361/752, 753, 361/704, 709, 707, 803, 760–761, 758, 719–720, 759, 801, 804; 174/138 G

(56) References Cited

U.S. PATENT DOCUMENTS 5,241,453 A * 8/1993 Bright et al. ................ 361/704
6,201,697 B1 * 3/2001 McCullough ............... 174/16.3
6,219,244 B1 * 4/2001 Chen .......................... 361/704

* cited by examiner

Primary Examiner—David Martin
Assistant Examiner—Thanh Y. Tran
(74) Attorney, Agent, or Firm—Sughrue Mion, PLLC

(57) ABSTRACT

An attachment structure is constituted by: a rigid circuit board having a suitable circuit pattern formed on its back surface, having one or a plurality of attachment holes for mounting an electronic component on the rigid circuit board, and having soldering lands provided at the circumferential edges of the attachment holes on the back surface of the rigid circuit board; an electronic component having one or more clip pass-through holes located in positions corresponding to the attachment holes on the surface of the rigid circuit board so that the attachment holes and the clip pass-through holes agree with each other on the surface of the rigid circuit board; and clips which can be subjected to soldering, the clip penetrating the clip pass-through holes and the attachment holes from above the electronic component so that the rigid circuit board and the electronic component are positioned fixedly by the clips.

20 Claims, 6 Drawing Sheets

ATTACHMENT STRUCTURE OF ELECTRONIC COMPONENT TO CIRCUIT BOARD AND CLIP USED IN ATTACHMENT OF THE ELECTRONIC COMPONENT

BACKGROUND OF THE INVENTION

1. Field of the Invention

The present invention relates to an attachment structure to a circuit board, for example, for attaching an electronic component such as an instrument movement or the like to a rigid circuit board, and a clip used in the attachment. Particularly, the present invention relates to an attachment structure of an electronic component to a circuit board, by which the workability and economy in attachment of an attachment member to a rigid circuit board can be enhanced, and a clip for use in the attachment.

2. Description of the Related Art

For example, a conventional structure with which an instrument movement (electronic component) for use in assembling an on-vehicle instrument apparatus is attached to a rigid circuit board of the on-vehicle instrument apparatus will be described with reference to FIG. 10. The reference numeral 1 represents a rigid circuit board. A predetermined printed pattern circuit 2 is formed in the lower surface of the rigid circuit board 1.

The reference numeral 3 represents an instrument movement such as a speedometer, an engine tachometer, or the like, attached to the upper surface of the rigid circuit board 1. Although the instrument movement 3 does not have a feature in internal configuration, the schematic configuration thereof will be described as follows. The reference numeral 4 represents a housing made of resin. The housing 4 also has a function as a coil bobbin. Inside the housing 4, a movable magnet 5 is rotatably supported through a pointer shaft 6. In addition, a pair of coils are wound and retained around the housing 4 perpendicularly to each other so as to form a cross coil 7.

The reference numeral 8 represents a shield case disposed to cover the outside of the cross coil 7; 9, connection terminals connected to the cross coil 7; and 10, a pointer attached to a forward end of the pointer shaft 6.

When the instrument movement 3 configured thus is attached to the rigid circuit board 1, the instrument movement 3 is put on the upper surface of the rigid circuit board 1. Further, attachment holes 11 provided in the rigid circuit board 1 are made to agree with threaded holes 12 formed in the housing 4 of the instrument movement 3. Then, attachment screws 13 are made to pass through the attachment holes 11 from the lower surface (back side) of the rigid circuit board 1. The attachment screws 13 are screwed down into the threaded holes 12 of the instrument movement 3 so that the rigid circuit board 1 and the instrument movement 3 are screwed to each other.

In such a manner, in the attachment structure in which the rigid circuit board 1 and the instrument movement 3 are screwed to each other by the attachment screws 13, a plurality of attachment screws 13 for screwing must be prepared in advance, and a screwing step for screwing the plurality of attachment screws is required. From such a point, the attachment structure is inferior in the workability and economy in attachment of the instrument movement.

In addition, after the instrument movement 3 is screwed to the rigid circuit board 1, the lower surface of the rigid circuit board 1 is immersed in a flow soldering tank so that the connection terminals 9 projecting from the lower surface of the rigid circuit board 1 are soldered with the printed circuit 2. At this time, however, there arises a problem that solder balls repelled by the head portions of the attachment screws 13 adhere to a circuit portion of the rigid circuit board so as to cause an electric connection failure (short-circuit due to a solder bridge or the like).

As mentioned above, when the head of each attachment screw is immersed into the flow soldering tank, the head thereof might repel the solder to form the solder balls. On occasion, the solder balls are attached to another soldering potion which might arise a loose connection in the circuit board 1. In order to avoid the loose connection, in the conventional art, the IC, the resistor and the like except for the instrument movement 3 are flow-soldered in the flow soldering bath to electrically fix them to the circuit board 1. After that, the instrument movement 3 is screwed and fixed to the circuit board 1, and then the terminals of the instrument movement 3 are spot-soldered with the wiring pattern of the circuit board 1 so that the instrument movement 3 is fixed and electrically connected with the circuit board 1. Therefore, the soldering of the instrument movement 3 and the soldering of other electronic components, such as an IC, a resistor and the like, have to be performed in separate steps, respectively. Two soldering steps are required in total.

To solve such a problem, it can be considered to give surface treatment to the head portions of the attachment screws 13 so as to make solder easy to adhere to the head portions. However, it is not practical because the treatment cost increases when surface treatment is given to the respective head portions of the attachment screws 13 so as to make solder easy to adhere to the head portions.

On the other hand, if the soldering is carried out by a robot without using the flow soldering tank as means for soldering the connection terminals 9 with the circuit portion of the rigid circuit board, it is possible to restrain generation of solder balls on the head portions of the attachment screws 13. However, in such robot soldering means, it is necessary to solder respective portions to be soldered one by one. Therefore, it takes much time for soldering so that the assembling productivity deteriorates.

Alternately, there has been proposed to provide a resin engagement nail integrally formed with a resin bobbin with which a coil is wound. In the attachment process, the resin engagement nail is fixed to the circuit board 1. However, since the engagement nail is made of resin, the resin engagement nail deforms due to the heat generated in the flow soldering. To avoid the deformation of the resin engagement nail, only the IC, the resistor and the like are flow-soldered in the flow soldering bath to electrically fix them to the circuit board 1. After that, the instrument movement 3 is fixed to the circuit board 1 through the resin engagement nail, and then the terminals of the instrument movement 3 are spot soldered with the printing pattern of the circuit board 1 so that the instrument movement 3 is fixed and electrically connected with the circuit board 1 without deformation of the resin engagement nail. In this method, the two soldering steps are also required in total.

To improve the attaching efficiency of the instrument movement 3, it is possible to use a bobbin a resin engagement nail made of high heat resistance resin. However, the high heat resistance resin is expensive in general, which increases the manufacturing cost thereof, and therefore it is not practical.

SUMMARY OF THE INVENTION

The present invention is made in consideration of such facts in the conventional. It is an object of the present invention to enable an electronic component such as an instrument movement or the like to be fixed to a rigid circuit board simply and easily without using any attachment screw when the electronic component is attached to the rigid circuit board, so that the number of man-hours for fastening attachment screws is omitted.

It is also an object of the present invention to carry out the soldering work for a connection circuit in the lower surface (back surface) of the rigid circuit board by use of a flow soldering tank so that the workability and economy of the soldering are enhanced.

To attain the foregoing first and second objects, according to an aspect of the present invention, there is provided an attachment structure of an electronic component to a circuit board comprising: a rigid circuit board having a suitable circuit pattern formed on a back surface thereof, having one or more attachment holes formed in the rigid circuit board for attachment of an electronic component, and further having soldering lands provided at circumferential edges of the attachment holes on the back surface of the rigid circuit board; an electronic component having one or more clip pass-through holes formed in positions in which the clip pass-through holes are coincident with the attachment holes correspondingly on a front surface of the rigid circuit board; and solderable clips for passing through the clip pass-through holes and the attachment holes correspondingly to perform fixed positioning of the electronic component to the rigid circuit board, each of the clips having an engagement portion portion at one end thereof and a pair of elastic engagement portions at the other end thereof, the engagement portion portion being engaged with a clip entrance side hole edge of corresponding one of the clip pass-through holes formed in the electronic component, the elastic engagement portions being engaged with a land formation surface side hole edge of corresponding one of the attachment holes provided in the rigid circuit board so that the elastic engagement portions can be displaced elastically in a direction of a hole diameter of the attachment hole; wherein, at the time when the rigid circuit board and the electronic component are fixedly positioned by the clips, the engagement portion portions of the clips are engaged with the electronic component, and forward end portions of the elastic engagement portions are soldered with the lands formed on the rigid circuit board.

Thus, according to this attachment structure, the attachment of the electronic component to the rigid circuit board can be ensured by the engagement force of the clips and the soldering between the clips and the lands provided on the rigid circuit board. As a result, the workability in attaching the electronic component to the rigid circuit board is improved on a large scale.

According to another aspect of the present invention, a clip for fixing the electronic component to the rigid circuit board is characterized by comprising: a solderable and flexible/elastic metal piece which is bent into an V-shape along a longitudinal direction thereof and along a center thereof so as to form a bent piece; a pair of flexible/elastic pieces formed by forming a notch slit along a ridge line formed by bending the metal piece into the pair of bent pieces in the longitudinal direction and from a middle of the ridge line toward a forward end of the metal piece; engagement protrusions formed in vicinities of forward end portions of the flexible/elastic pieces, the engagement protrusions being inserted into and engaged with attachment holes formed in a rigid circuit board, respectively; and engagement portion formed at edges of the bent piece parallel to a ridge line of the bent piece and opposite to the flexible/elastic pieces of the bent piece, the engagement portion being pressed into and engaged with a clip pass-through hole formed in an electronic component.

Thus, by using such a clip to fix an electronic component to a rigid circuit board, the rigid circuit board and the electronic component can be fixedly positioned by one touch. In addition, by fixing the clip to the rigid circuit board by soldering, it is possible to ensure the connection among the clip, the electronic component, and the circuit board. Thus, the workability in attachment of the electronic component to the rigid circuit board becomes excellent.

BRIEF DESCRIPTION OF DRAWINGS

FIG. 5A being an inclined view of the surface side of the clip, FIG. 5B being, an inclined view of the back surface side thereof, FIG. 5C being, a back view thereof, FIG. 5D being a side view thereof.

DETAILED DESCRIPTION OF THE PRESENT INVENTION

Figure 1:
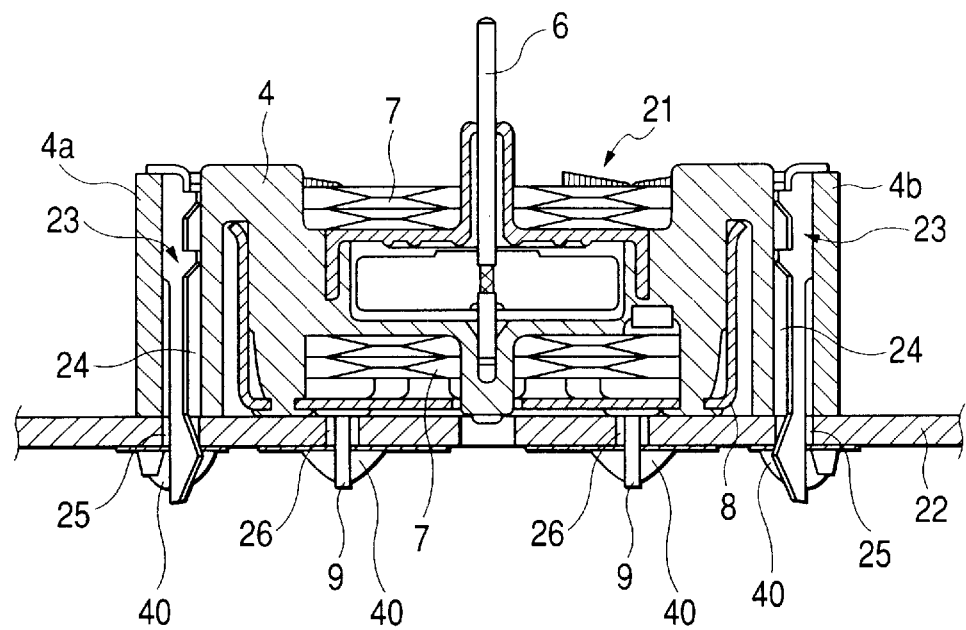
FIG. 1 is an explanatory sectional view showing an embodiment of an attachment structure according to the present invention.

The present invention will be described below in detail with respect to an embodiment illustrated in the drawings.

FIG. 1 is an explanatory view showing the condition that an instrument movement 21 as an electronic component has been attached to a rigid circuit board 22 by use of clips 23. The electronic component 21 for use in the attachment structure according to the present invention is not limited to the instrument movement. In addition, the illustrated internal configuration of the instrument movement is substantially the same as that of the instrument movement described in the conventional art example. Therefore, constituent parts the same as those in the conventional art example are referenced correspondingly, and the description of the constituent parts will be omitted.

Figure 6:
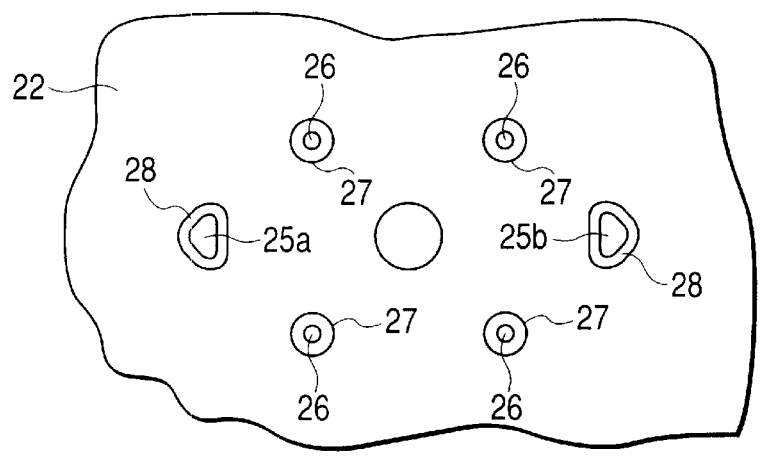
FIG. 6 is a back view of a circuit board for use in the attachment structure according to the present invention.

In a resin housing 4 of the instrument movement 21 according to this embodiment, arm portions 4a and 4b face with each other so that a pointer shaft 6 to be the center of the instrument movement 21 is located between the arm portions 4a and 4b, the arm portions 4a and 4b extending to the outside of a shield case 8. In addition, clip pass-through holes 24 are provided to penetrate the arm portions 4a and 4b from their surface sides to their back surface sides respectively. On the other hand, as shown in FIG. 6, in the rigid circuit board 22 to which the instrument movement 21 is to be attached, a plurality of attachment holes 25a and 25b are provided to be located correspondingly to the clip pass-through holes 24. In addition, a plurality of terminal insertion holes 26 are provided so as to be penetrated by connection terminals 9 provided in the rigid circuit board 22. Incidentally, the pair of attachment holes 25a and 25b are formed in the rigid circuit board 22 as substantially triangular holes corresponding to the sectional external shapes of clips 23 which will be described later. In addition, a pair of attachment holes 25a and 25b are formed as a pair of substantially triangular holes so that one side of one triangular hole is opposite to and parallel to one side of the other triangular hole, the triangular holes 25a and 25b being located so as to be axially symmetrical.

Figure 7A:
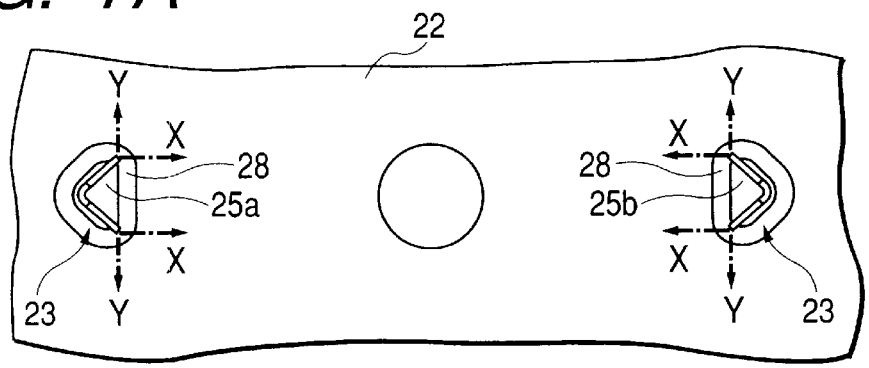
FIG. 7A is an enlarged back view of the circuit board.
Figure 7B:
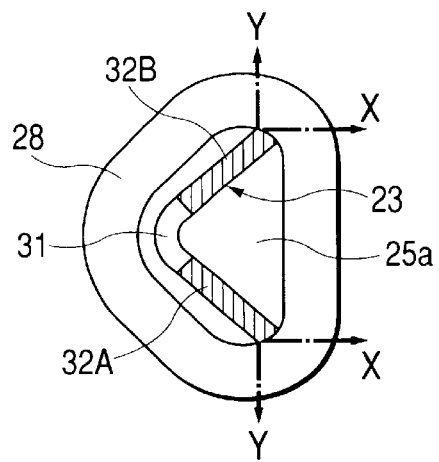
FIG. 7B is an enlarged view of a land portion thereof.

In addition, in the back surface of the rigid circuit board 22, as shown in FIG. 6 and FIGS. 7A and 7B, terminal soldering lands 27 are formed at the circumferential edges of the terminal insertion holes 26. On the other hand, clip soldering lands 28 are formed at the circumferential edges of the attachment holes 25a and 25b respectively.

Next, description will be made with reference to FIGS. 5A to 5D about the configuration of each of the clips 23 for use to fix the electronic component 21 to the rigid circuit board 22. Each of the clips 23 is formed of a flexible/elastic metal plate of a solderable material such as brass by pattern-draw press means. As for the shape of the clip 23, the metal plate with the shorter side at the top is bent into an V-shape so that a ridge line 29 is formed along its longitudinal center. Thus, two bent pieces 30A and 30B are formed. In addition, the metal plate is notched from the middle of the ridge line 29 toward the forward end so that a slit 31 is formed along the ridge line 29 formed by bending the metal plate in the longitudinal direction. Thus, a pair of flexible/elastic pieces 32A and 32B are formed respectively.

Further, in the forward end portions of the pair of flexible/elastic pieces 32A and 32B, engagement protrusions 34A and 34B are formed to have inclined edges 33A and 33B projecting outward in the direction opposite to the slit 31. In addition, the end portions of the two bent pieces 30A and 30B opposite to the flexible/elastic pieces 32A and 32B are bent outward at right angles so as to form engagement collars 35A and 35B respectively. Further, at the edges of the two bent pieces 30A and 30B, engagement portion 36 are formed to be pressed into and engaged with the clip pass-through holes 24 formed in the electronic component 21.

Incidentally, on the inner surfaces of the two bent pieces 30A and 30B, protrusions 37 are formed by press work. The protrusions 37 operate to prevent respective clips put on top of one another from coming into close contact, and make the clips easy to be handled one by one.

The rigid circuit board 22, the electronic component 21 and the clips 23 are configured thus according to the present invention. Next, description will be made about the procedure of attaching the electronic component 21 onto the rigid circuit board 22 by use of the clips 23.

Figure 2:
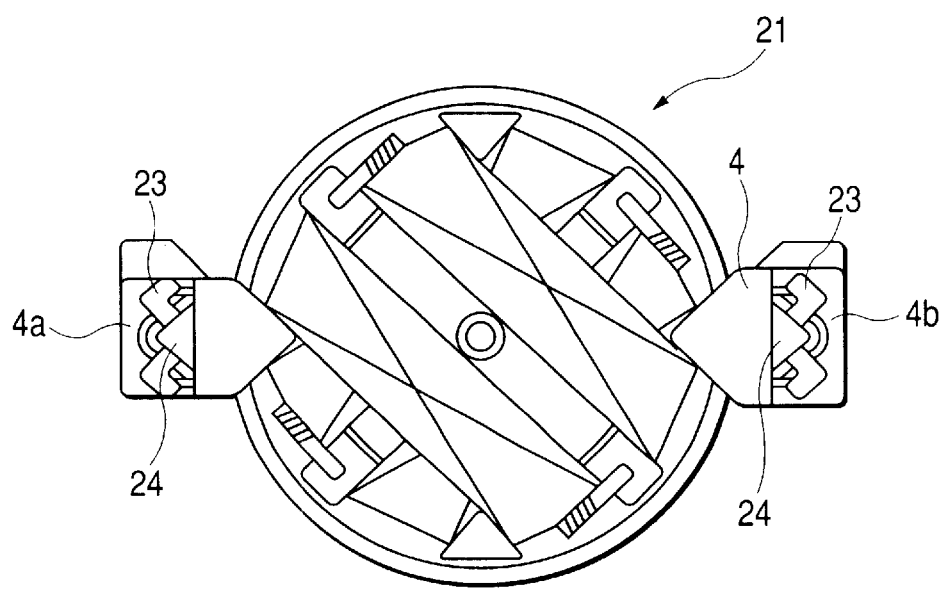
FIG. 2 is a plan view showing an embodiment of an electronic component for use in the attachment structure according to the present invention.
Figure 3:
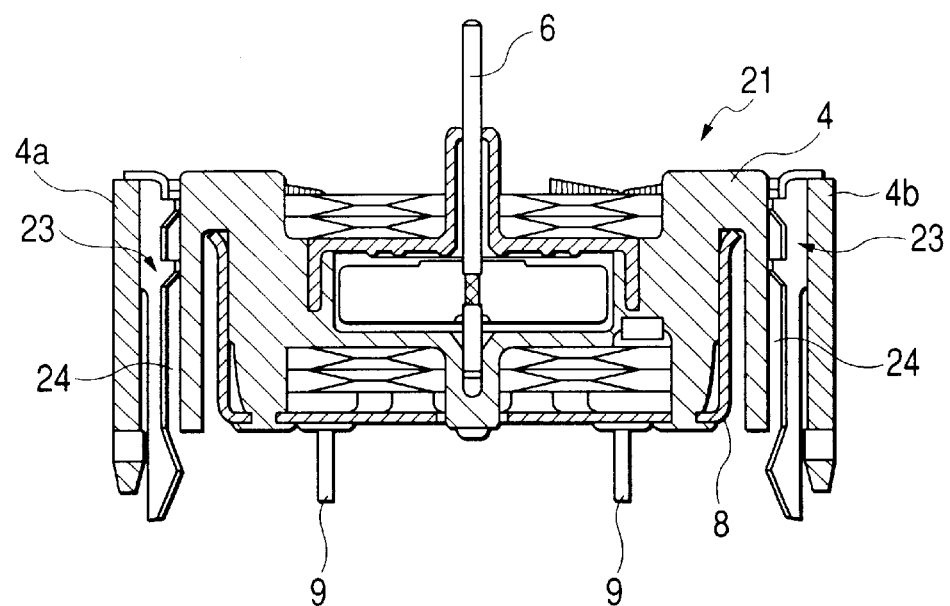
FIG. 3 is a front sectional view of the electronic component for use in the attachment structure according to the present invention.
Figure 4:
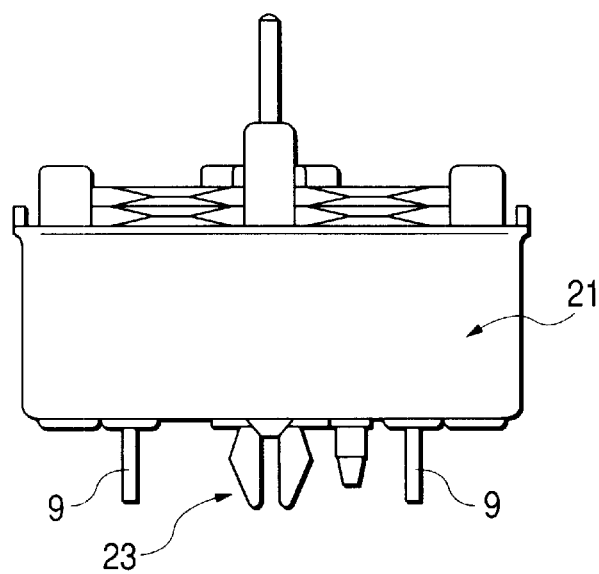
FIG. 4 is a side view of the electronic component for use in the attachment structure according to the present invention.
Figure 5A:
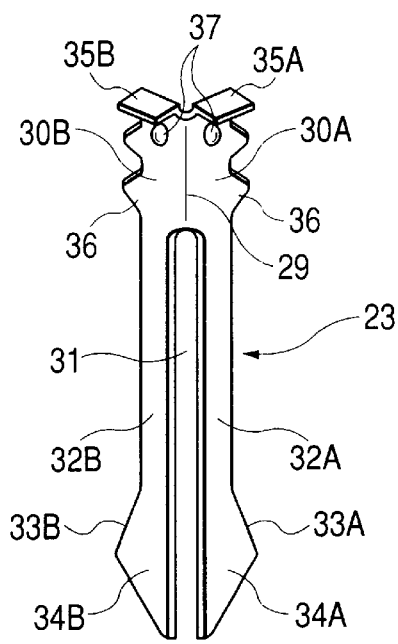
FIGS. 5A to 5D are views of a clip for use in the attachment structure according to the present invention.
Figure 5B:
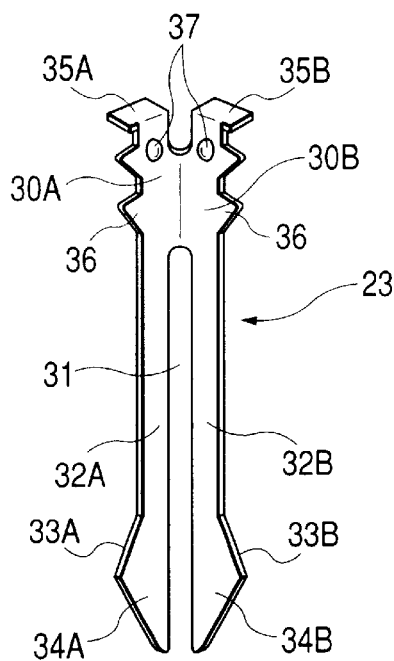
Figure 5C:
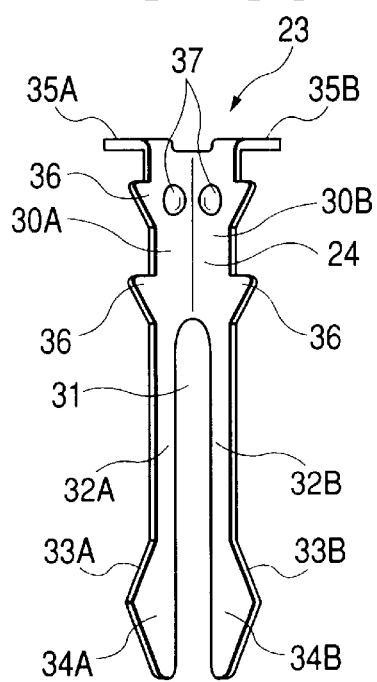
Figure 5D:
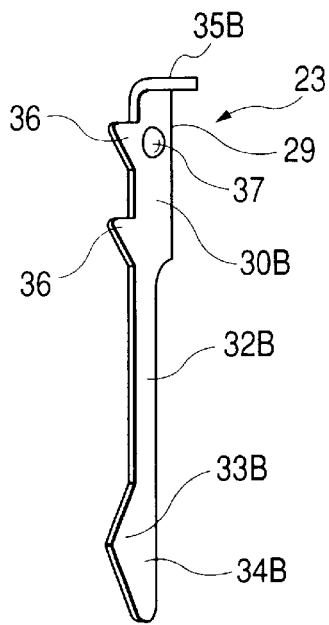

First, as shown in FIGS. 2 and 3, the forward ends of the clips 23 on the sides of the engagement protrusions 34A and 34B are inserted respectively from above the corresponding clip pass-through holes 24 formed in the electronic component 21. The clips 23 are pressed into the clip pass-through holes 24 entirely so that the clip forward ends project from the lower end surface of the electronic component 21. As a result, the engagement collars 35A and 35B formed in each of the clips 23 are brought into contact and engaged with the upper surface of the electronic component 21 while the engagement portion 36 formed in each of the clips 23 are pressed into and engaged with the inner surfaces of the clip pass-through holes 24. Thus, the clips 23 are fixedly attached to the electronic component 21. Incidentally, at this time, the pair of clips 23 are attached to the movement 21 so that the ridge lines 29 of the clips 23 are located to face outside, and the sides of the clips opened in V-shapes are directed inside to be opposed to each other.

Figure 8:
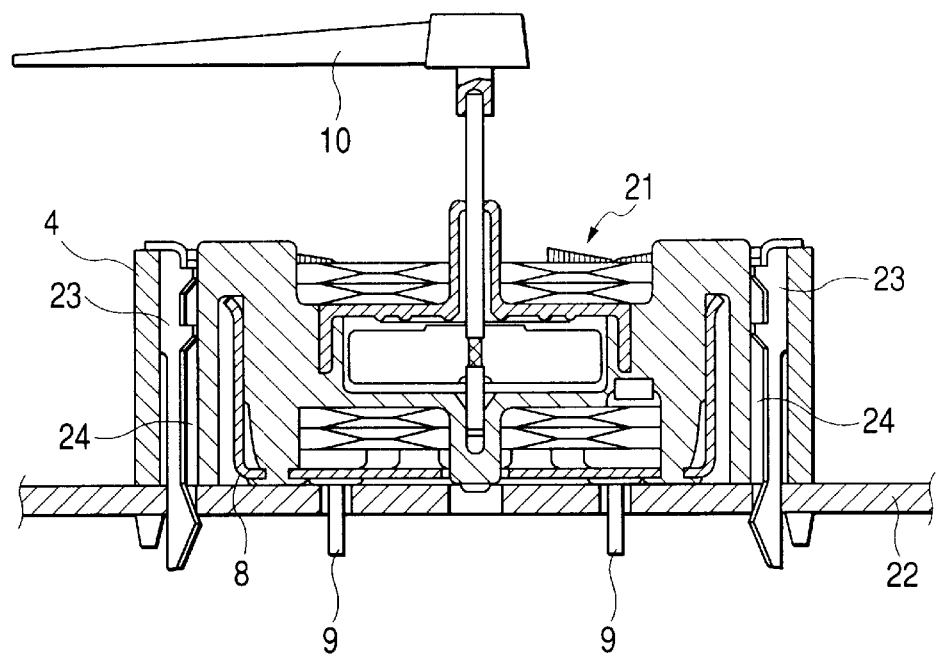
FIG. 8 is an explanatory view showing the attachment procedure of the attachment structure according to the present invention.

Next, the lower surface of the electronic component 21 to which the clips 23 have been fixedly attached is laid on the upper surface of the rigid circuit board 22. In this condition, as shown in FIG. 8, first, the engagement protrusions 34A and 34B at the forward ends of the clips 23 fixedly attached to the electronic component 21 are passed through the attachment holes 25a and 25b formed in the rigid circuit board 22. Then, the engagement protrusions 34A and 34B are engaged with the back-side hole edges of the attachment holes 25a and 25b by use of the elastic restitution force of the flexible/elastic pieces 32A and 32B. Incidentally, the connection terminals 9 provided in the electronic component are inserted into the terminal insertion holes 26 provided in the rigid circuit board 22 after the forward ends of the clips 23 have been inserted and positioned into the attachment holes 25a and 25b formed in the rigid circuit board 22.

Figure 9:
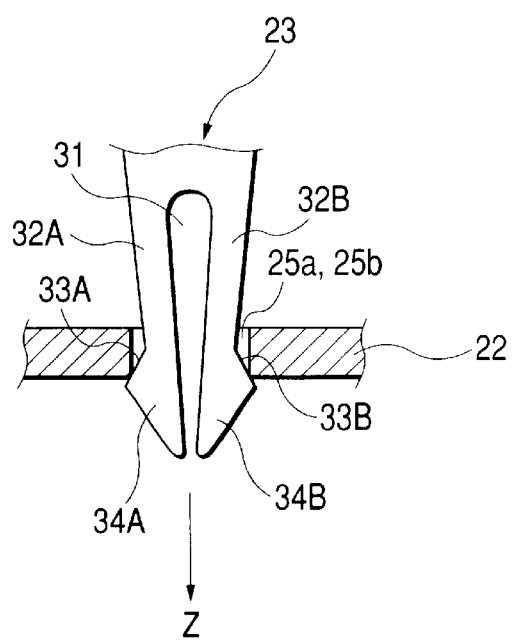
FIG. 9 is a main portion enlarged view showing the condition that the clip and the circuit board have been engaged in the attachment structure according to the present invention.
Figure 10:
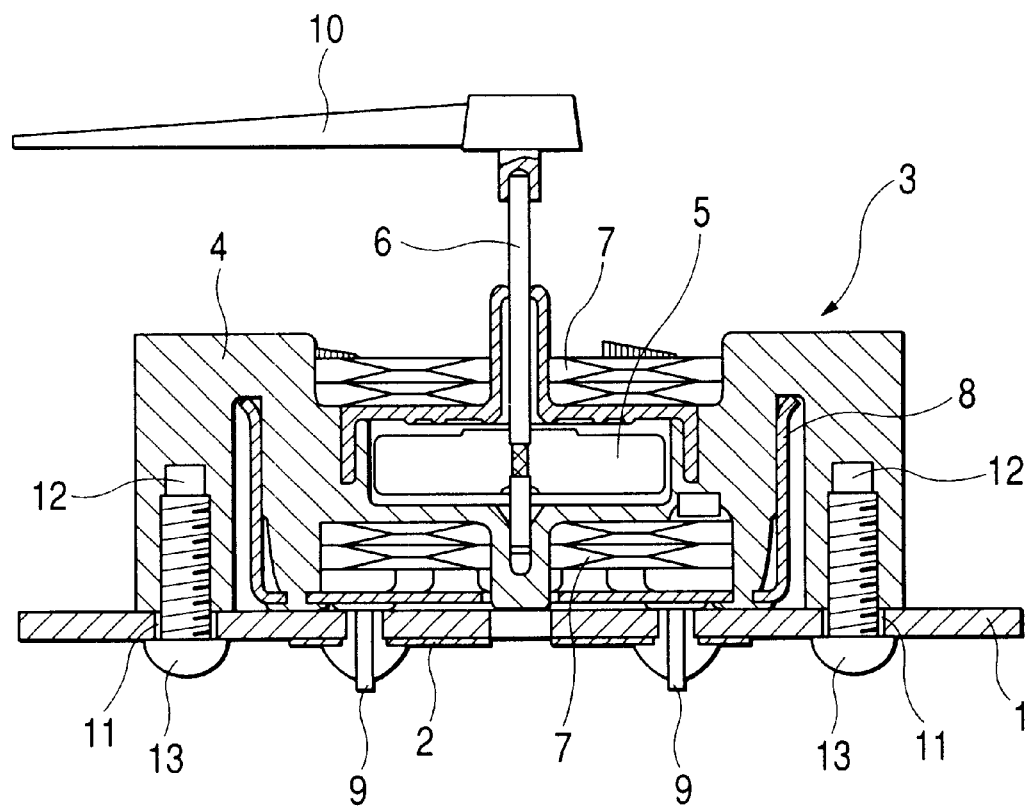
FIG. 10 is an explanatory view showing a conventional art attachment structure.

At this time, the inclined edges 33A and 33B forming the two engagement protrusions 34A and 34B are brought into elastic contact with the back-side hole edges of the attachment holes 25a and 25b as shown in FIG. 9. As a result, the engagement protrusions 34A and 34B brought into contact with the back-side hole edges of the attachment holes 25a and 25b by the elastic pressure of the flexible/elastic pieces 32A and 32B generate a force acting in the downward direction (Z). Thus, the lower surface of the electronic component 21 is brought into contact with the upper surface of the rigid circuit board 22 through the clips 23 without looseness so that the electronic component 21 is positioned on the rigid circuit board 22 stably.

In addition, the clips 23 are designed to be bent in the V-shapes and to be engaged with the triangular attachment holes 25a and 25b formed in the rigid circuit board 22. Accordingly, not only does a force act in the Z-direction but also a force acts horizontally in a direction opposite to the X-direction and the Y-direction, as shown in FIGS. 7A and 7B. Further, in this embodiment, a pair of clips 23 are disposed so that the ridge lines 29 thereof are located to face outside while the sides of the clips 23 opened in the V-shapes are opposed to each other. Accordingly, forces acting in the X-direction shown in FIG. 7A act in direction in which the clips 23 are opposite to each other. Thus, the movement 21 is supported and held also horizontally on the rigid circuit board 22 so that the movement 21 can be retained more firmly.

The rigid circuit board 22 on which the electronic component 21 has been positioned thus has the lower surface immersed in molten solder in a flow soldering tank (not shown). Thus, soldering is carried out between the connection terminals 9 and the terminal soldering lands 27 provided on the back surface (lower surface) of the rigid circuit board 22, and between the protrusion portions at the forward ends of the clips 23 and the clip soldering lands 28 provided on the back surface (lower surface) of the rigid circuit board 22.

By the soldering between the clips 23 and the clip soldering lands 28, the fixation (attachment) of the electronic component 21 to the rigid circuit board 22 is ensured through the clips 23 fixed to the rigid circuit board 22. Here, reference numerals 40 in FIG. 1 represent soldered portions which solder the connection terminal 9 with the terminal soldering land 27, or which solder the forward end of the clip 23 with the clip soldering land 28.

Thus, according to the attachment structure for attaching the electronic component to the circuit board in this embodiment, the clips are inserted into the clip pass-through holes 24 formed in the electronic component 21, and the attachment holes formed in the rigid circuit board 22, so as to ensure the positioning between the electronic component 21 and the rigid circuit board 22. Further, the clips are fixed to the electronic component 21 and the rigid circuit board 22 by soldering so that the fixation between the electronic component 21 and the rigid circuit board 22 is maintained. Accordingly, the work (step) of fastening attachment screws in the conventional art can be omitted. Thus, the workability in attachment of the electronic component to the rigid circuit board is improved on a large scale.

In addition, each of the clips 23 used in this embodiment is designed to have a pair of flexible/elastic pieces 32A and 32B which are provided with inclined edges 33A and 33B in the forward ends of the flexible/elastic pieces 32A and 32B respectively. Accordingly, at the time of the engagement operation by the clips 23, the inclined edges 33A and 33B of the clips 23 are brought into elastic contact with the lower surface hole edges of the attachment holes 25a and 25b. As a result, the clips 23 are urged to bring the lower surface of the electronic component 21 into pressure contact with the upper surface of the rigid circuit board 22. Thus, by use of the clips 23, it is possible to ensure the positioning between the electronic component 21 and the rigid circuit board 22.

Incidentally, in this embodiment, the clips are inserted from above so that the rigid circuit board is attached to the lower surface side of the electronic component. However, the present invention is not limited to this embodiment. As well as the aforementioned embodiment, the attachment hole 25a and 25b may be formed above the electronic component 21, in which the soldering land and the printed pattern face upward. In such a case, the clips are inserted from below the electronic component 21.

As has been described above, according to the attachment structure of the present invention, the attachment of the electronic component to the rigid circuit board can be ensured by the engagement force of the clips and the soldering between the clips and the lands provided on the rigid circuit board. Thus, the workability in attachment of the electronic component to the rigid circuit board is improved on a large scale.

In addition, by use of the clips of the present invention, fixation and positioning between the rigid circuit board and the electronic component can be achieved by one touch. In addition, the clips and the rigid circuit board are fixed by soldering. Thus, the connection among the clips, the electronic component and the circuit board can be ensured so that the workability in attachment of the electronic component to the rigid circuit board becomes superior.

In addition, according to the invention, the movement and electronic components such as an IC and resistor can be flow-soldered at the same time by the use of the metal clips of the invention.

What is claimed is:
1. An attachment structure comprising:

a circuit board having a first surface and a second surface, the circuit board having an attachment hole;

an electronic component disposed on the first surface of the circuit board, the electronic component having a pass-through hole; and a clip for passing through the pass-through hole and the attachment hole, wherein the circuit board is soldered with the clip to fix and position the electronic component to the circuit board, wherein the clip has a press-fitting protrusion inserted into the pass-through hole and press-fitted with the inner surface of the path-through hole of the electronic component.

2. The attachment structure as claimed in claim 1, wherein the clip has an engagement portion at a first end of the clip, the engagement portion being engaged with the clip entrance side hole edge of the pass-through hole of the electronic component.

3. The attachment structure as claimed in claim 1, wherein the clip has an elastic engagement portion at a second end of the clip, the elastic engagement portion being engaged with the hole edge of the attachment hole of the circuit board.

4. The attachment structure as claimed in claim 3, wherein the elastic engagement portion is engaged with the hole edge at the second surface of the circuit board.

5. The attachment structure as claimed in claim 4, wherein the elastic engagement portion is elastically displaceable in the diameter direction of the attachment hole.

6. The attachment structure as claimed in claim 1, wherein the circuit board has a wiring pattern on the second surface, and the clip is soldered on the second surface.

7. The attachment structure as claimed in claim 6, wherein the circuit board includes a soldering land provided at the circumferential edge of the attachment hole on the second surface of the circuit board, and the clip is soldered at the soldering land.

8. The attachment structure as claimed in claim 1, wherein the circuit board is rigid.

9. The attachment structure as claim in claim 1, wherein the attachment hole comprises a plurality of attachment holes formed in the circuit board, and the soldering land comprises a plurality of soldering lands provided at the circumferential edge of each of the attachment holes on the second surface of the circuit board.

10. The attachment structure as claimed in claim 1, wherein the clip is made of metal.

11. The attachment structure as claimed in claim 1, wherein the clip has two bent pieces formed by being bent in a V-shape along with a center line of the clip.

12. The attachment structure as claimed in claim 11, wherein the clip defines a slit along with the centerline of clip to have two flexible pieces in the two bent pieces, respectively.

13. The attachment structure as claimed in claim 1, wherein the elastic engagement portion has a slope portion engaged with the hole edge of the attachment hole.

14. The attachment structure according to claim 1, wherein the attachment hole of the circuit board has a triangular shape.

15. A clip used in attachment of an electronic component to a circuit board, the clip for passing through a pass-through hole of the electronic component and an attachment hole of the circuit board, wherein the circuit board is soldered with the clip to fix and position the electronic component to the circuit board, the clip comprising:

an engagement portion at a first end of the clip, the engagement portion being engaged with the clip entrance side hole edge of the pass-through hole of the electronic component;

an elastic engagement portion at a second end of the clip, the elastic engagement portion being engaged with the hole edge of the attachment hole of the circuit board; and a press-fitting protrusion to be inserted into the pass-through hole of the electronic component and press-fitted with the inner surface of the path-through hole of the electronic component.

16. The clip as claimed in claim 15, wherein the elastic engagement portion is elastically displaceable in the diameter direction of the attachment hole.

17. The clip as claimed in claim 15, wherein the clip is made of metal.

18. The clip as claimed in claim 15, further comprising two bent pieces formed by being bent in a V-shape along with a center line of the clip.

19. The clip as claimed in claim 15, further comprising a slit along with the centerline of clip to have two flexible pieces in the two bent pieces, respectively.

20. The clip as claimed in claim 15, wherein the elastic engagement portion has a slope portion engaged with the hole edge of the attachment hole.

* * * * *